(12) United States Patent
Fan et al.

(10) Patent No.: US 9,634,221 B2
(45) Date of Patent: Apr. 25, 2017

(54) THIN-FILM THERMO-ELECTRIC GENERATOR AND FABRICATION METHOD THEREOF

(71) Applicant: SHENZHEN UNIVERSITY, Shenzhen, Guangdong (CN)

(72) Inventors: Ping Fan, Shenzhen (CN); Dongping Zhang, Shenzhen (CN); Zhuanghao Zheng, Shenzhen (CN); Guangxing Liang, Shenzhen (CN)

(73) Assignee: SHENZHEN UNIVERSITY, Shenzhen, Guangdong (CN)

( * ) Notice: Subject to any disclaimer, the term of this patent is extended or adjusted under 35 U.S.C. 154(b) by 0 days.

(21) Appl. No.: 14/973,742

(22) Filed: Dec. 18, 2015

(65) Prior Publication Data

US 2016/0104830 A1    Apr. 14, 2016

Related U.S. Application Data

(63) Continuation of application No. 13/126,076, filed on Apr. 26, 2011, now Pat. No. 9,299,907.

(51) Int. Cl.
*H01L 35/32* (2006.01)
*H01L 35/34* (2006.01)

(52) U.S. Cl.
CPC .............. *H01L 35/34* (2013.01); *H01L 35/32* (2013.01)

(58) Field of Classification Search
CPC ......... H01L 21/20; H01L 35/32; H01L 35/34; H01L 35/08
See application file for complete search history.

(56) References Cited

U.S. PATENT DOCUMENTS

| | | | | |
|---|---|---|---|---|
| 6,043,423 A * | 3/2000 | Satomura | ................ | H01L 35/08 136/203 |
| 2008/0271882 A1* | 11/2008 | Irwin | ...................... | E21B 43/34 166/57 |
| 2009/0077805 A1* | 3/2009 | Bachrach | ................ | B26F 3/002 29/890.033 |
| 2010/0154856 A1* | 6/2010 | Hiroyama | ............... | H01L 35/32 136/236.1 |

FOREIGN PATENT DOCUMENTS

JP    H08125240 A    *  5/1996
JP    2004140048 a   *  5/2004

OTHER PUBLICATIONS

JPH08125240A, 1996 English Equivalent of the Specification Yamazaki et al.*
jp2004140048a (2004) Tomonari et al., English machine translation.*

* cited by examiner

*Primary Examiner* — Susan D Leong
(74) *Attorney, Agent, or Firm* — Raymond Y. Chan; David and Raymond Patent Firm

(57) ABSTRACT

A method of manufacturing a thin-film thermo-electric generator includes the steps of: forming two or more PN junctions each having a three-layer structure; forming a substrate which has a first side and an opposed second side; coupling the PN junctions at the first side of the substrate to define a first group of PN junctions at the first side of the substrate; and providing two electrodes that one of the electrodes is extracted from the first group of PN junctions. Accordingly, each of the PN junctions is formed by depositing an insulating thin-film layer between a P-type thermo-electric thin-film layer and a N-type thermo-electric thin-film layer.

14 Claims, 13 Drawing Sheets

THIN-FILM THERMO-ELECTRIC GENERATOR AND FABRICATION METHOD THEREOF

CROSS REFERENCE OF RELATED APPLICATION

This is a Continuation application that claims priority to U.S. non-provisional application, application Ser. No. 13/126,076, filed Apr. 26, 2011, which claims priority to international application number PCT/CN2009/075419, international filing date Dec. 9, 2009.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

This invention relates to thermo-electric technology, and more particularly to a thin-film thermo-electric generator and fabrication method thereof.

Description of Related Arts

The thermo-electric generator is a kind of generator made on the basis of Seebeck Effect, the heat energy is transformed into electric energy. The working principle of thermo-electric generator is that connecting one end of two different metals or two different types of thermo-electric conversion materials P-type and N-type semiconductors, placing this end in high temperature condition, and placing the other end in low temperature condition. Compared with the other end, the end in high temperature condition has better thermal activation and higher density of electrons and holes, the electrons and holes spread to the end in low temperature condition, thus an electric potential difference is formed in the end in low temperature condition. Combing a number of this kind of thermo-electric conversion materials P-type and N-type semiconductors to form a module supplying adequate voltage, this module becomes a thermo-electric generator.

The thermo-electric generator is a kind of clean, noiseless energy without discharging any hazardous substance, having high reliability and long useful time, and supplying long, safe, continuous and stable electricity output. Presently the thermo-electric generator is made by cutting and welding the thermo-electric materials. There are two types of fabrication methods. In the first method, depositing a photosensitive resist on the same chip, then forming a P-type and N-type area through double photo etching respectively, and finally depositing P-type and N-type thermo-electric materials in the P-type and N-type area respectively. This method is difficult for application, especially for the procedure of combining thermo-electric units in which the chip is required to be stripped from the deposited thermo-electric units. In the second method, P-type and N-type thermo-electric unit chip is separately manufactured, in the fabrication of micro thin-film thermo-electric generator, the conducting layer connecting P-type and N-type thermo-electric units can be manufactured on condition that the chip is not stripped from the deposited thermo-electric units. This method has complicated procedures, and the thin-film of the thermo-electric generator is merely limited to single thin-film, so the performance is limited.

SUMMARY OF THE PRESENT INVENTION

To solve the above-mentioned problems, this invention provides a thin-film thermo-electric generator and fabrication method thereof, improving the performance and simplifying the fabrication processes.

The technical solutions of the present invention are as follows:

A thin-film thermo-electric generator comprises a substrate, a P-type thermo-electric thin-film layer, an insulating thin-film layer and a N-type thermo-electric thin-film layer is repeatedly deposited in turns on one side of said substrate, a group of said P-type thermo-electric thin-film layer, said insulating thin-film layer and said N-type thermo-electric thin-film layer forms a three-layer structure, said P-type thermo-electric thin-film layer and said N-type thermo-electric thin-film layer of said three-layer structure is connected in one end of said insulating thin-film layer to form a PN junction, an insulating layer is provided between two said adjacent PN junctions, and said two adjacent PN junctions is connected in one end of said insulating layer, in order to form a serial PN junction, an electrode is extracted from the outermost thin-film layer on one side of said substrate and another electrode is extracted from one side of the substrate deposited by thermo-electric thin-film layer.

A thin-film thermo-electric generator, wherein the thickness range of said substrate is 0.1 mm-100 mm, the thickness range of said P-type thermo-electric thin-film layer is 1 nm-10 μm, the thickness range of said N-type thermo-electric thin-film layer is 1 nm-10 μm.

A thin-film thermo-electric generator, wherein the shape of said substrate is regular rectangle.

A thin-film thermo-electric generator comprises a substrate, a P-type thermo-electric thin-film layer, an insulating thin-film layer and a N-type thermo-electric layer is repeatedly deposited in turns on one side of said substrate, a group of said P-type thermo-electric thin-film layer, said insulating thin-film layer and said N-type thermo-electric thin-film layer forms a three-layer structure, said P-type thermo-electric thin-film layer and said N-type thermo-electric thin-film layer of said three-layer structure is connected in one end of said insulating thin-film layer to form a PN junction, an insulating layer is provided between two said adjacent PN junctions, and said two adjacent PN junctions is connected in one end of the insulating layer, in order to form a serial PN junction, two electrodes is respectively extracted from the outermost thin-film layer on two sides of said substrate.

A method for fabrication a thin-film thermo-electric generator comprises steps as follows:

selecting a substrate and sheltering one side of said substrate;

presetting an electrode on a surface of said substrate;

depositing a P-type thermo-electric thin-film layer on the side of the substrate on which the electrode is preset;

sheltering said substrate, one end and all sides of deposited thin-film layer, depositing an insulating thin-film layer on said P-type thermo-electric thin-film layer;

sheltering said substrate and all sides of deposited thin-film layer, depositing a N-type thermo-electric thin-film layer on said insulating thin-film layer to form a three-layer structure, the P-type thermo-electric thin-film layer and N-type thermo-electric thin-film layer of said three-layer structure is connected in said sheltered end of the substrate to form a PN junction;

repeating above-said steps to form multiple PN junctions;

sheltering said substrate, the other end and all sides of the deposited thin-film layers, depositing an insulating thin-film layer between every two adjacent PN junctions, said two adjacent three-layer PN junctions are connected in the other end of said deposited thin-film layers to form a PN junction in series;

extracting another electrode from the outermost thin-film layer of the last three-layer PN junction, to form the main structure of a thin-film thermo-electric generator.

A method for fabrication a thin-film thermo-electric generator, depositing multilayer on the two sides of the substrate, and further comprises steps as follows:

selecting a substrate and sheltering one side of said substrate;

depositing a P-type thermo-electric thin-film layer on the side of the substrate;

sheltering said substrate, one end and all sides of deposited thin-film layer, depositing an insulating thin-film layer on said P-type thermo-electric thin-film layer;

sheltering said substrate and all sides of deposited thin-film layer, depositing a N-type thermo-electric thin-film layer on said insulating thin-film layer to form a three-layer structure, the P-type thermo-electric thin-film layer and N-type thermo-electric thin-film layer of said three-layer structure is connected in said sheltered end of the substrate to form a PN junction;

repeating above-said steps to form multiple PN junctions;

sheltering said substrate, the other end and all sides of the deposited thin-film layers, depositing an insulating thin-film layer between every two adjacent PN junctions, said two adjacent three-layer PN junctions are connected in the other end of said deposited thin-film layers to form a PN junction in series;

extracting another electrode from the outermost thin-film layer of the last three-layer PN junction;

repeating above-said steps to form multiple serial three-layer PN junctions on the other side of said substrate, extracting another electrode from the outermost thin-film layer of the last three-layer PN junction on the other side of said substrate, to form the main structure of a thin-film thermo-electric generator.

For the thin-film thermo-electric generator and fabrication method of this invention, a P-type thermo-electric thin-film layer, an insulating thin-film layer and a N-type thermo-electric thin-film layer is deposited on a substrate to form a three-layer PN (Positive-Negative) junction, multiple three-layer PN junctions in series are available, an insulating thin-film layer is provided between every to serial three-layer PN junctions, and electrodes are extracted from the substrate and the outermost thin-film layer of the last three-layer thin-film PN junctions. The present invention applies the deposition of P-type thermo-electric thin-film layer, an insulating thin-film layer and a N-type thermo-electric thin-film layer to form a three-layer PN junction, thus thermo-electric generator is formed, during the deposition of the insulating thin-film layer, intentionally sheltering the substrate and one end of the deposited thin-film layer and depositing the P-type or N-type materials on the substrate and one end of the deposited thin-film layer directly, to form a connection of PN junction or a serial connection between two PN junction, the separate connection of the P-type or N-type materials is not required, simplifying the fabrication processes of the thin-film thermo-electric generator, owning to the characteristics of the thin-film thermo-electric materials and serial connection structure of multiple three-layer PN junctions, the performance of the thin-film thermo-electric generator is greatly improved.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

The present invention provides a thin-film thermo-electric generator and fabrication method thereof. To make the technical solutions of the present invention more comprehensible, the present invention is described in detail with reference to the accompanying drawings and embodiments as follows.

The First Embodiment

Figure 1A:
FIG. 1a-FIG. 1i are the schematic diagrams of the fabrication process of the first embodiment of the invention.
Figure 1B:
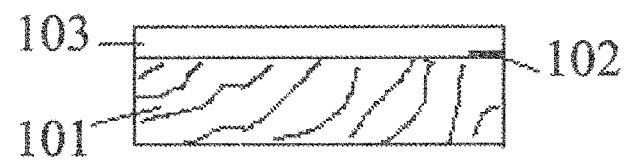
Figure 1C:
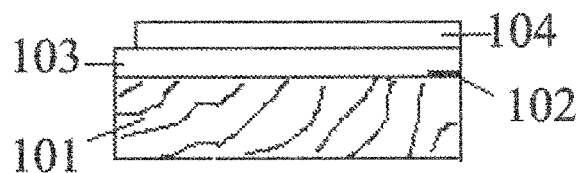
Figure 1D:
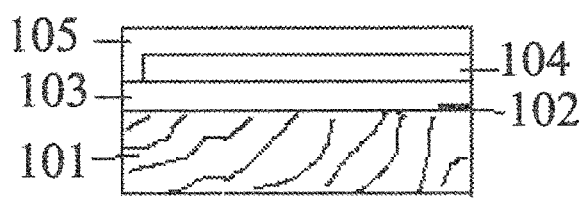
Figure 1E:
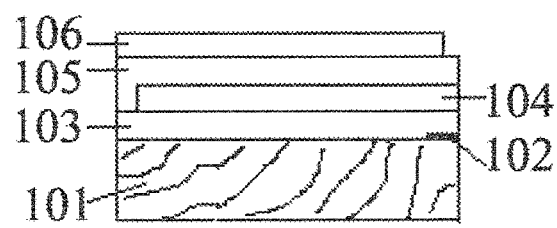
Figure 1F:
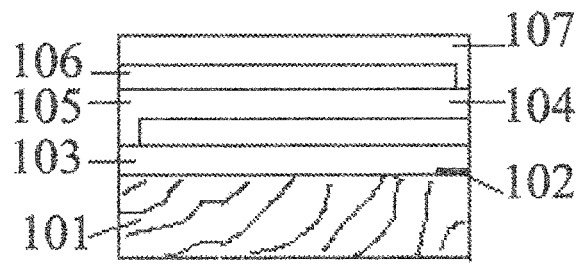
Figure 1G:
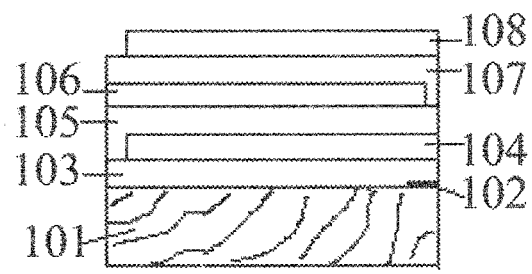
Figure 1H:
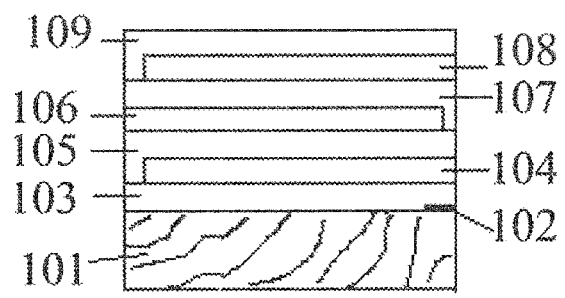
Figure 1I:
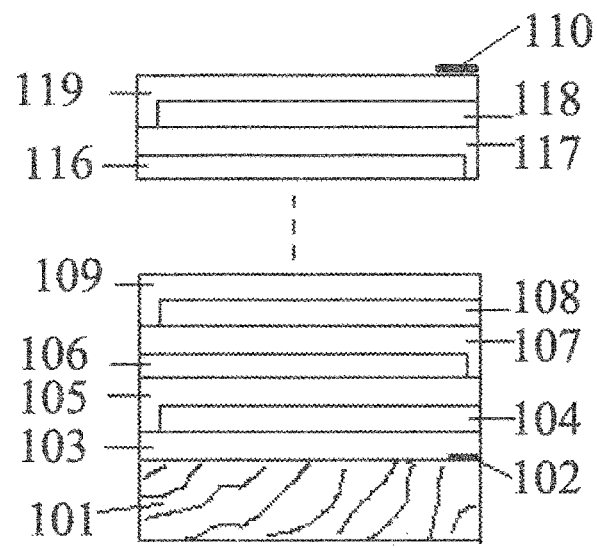

FIG. 1a-FIG. 1i are the schematic diagrams of the fabrication process of the first embodiment of the invention. FIG. 1i is the schematic diagrams of the end of the thin-film thermo-electric generator. In the first embodiment, the thin-film thermo-electric generator comprises an insulating substrate 101, an extractive electrode 102, a P-type thermo-electric thin-film layer 103, an insulating thin-film layer 104, a N-type thermo-electric thin-film layer 105, an insulating thin-film layer 106, a P-type thermo-electric thin-film layer 107, an insulating thin-film layer 108, a N-type thermo-electric thin-film layer 109, and an extractive electrode 110.

FIG. 1a shows a preset electrode 102 on a surface of the insulating substrate 101.

FIG. 1b shows a P-type thermo-electric thin-film layer 103 deposited on the side of the substrate on which the electrode is preset.

FIG. 1c shows an insulating thin-film layer 104 deposited on the P-type thermo-electric thin-film layer 103.

FIG. 1d shows a N-type thermo-electric thin-film layer 105 deposited on the insulating thin-film layer 104.

FIG. 1e shows an insulating thin-film layer 106 deposited on the N-type thermo-electric thin-film layer 105.

FIG. 1f shows a P-type thermo-electric thin-film layer 107 deposited on the insulating thin-film layer 106.

FIG. 1g shows an insulating thin-film layer 108 deposited on the P-type thermo-electric thin-film layer 107.

FIG. 1h shows a N-type thermo-electric thin-film layer 109 deposited on the insulating thin-film layer 108.

FIG. 1i shows the formation of an insulating thin-film layer 116, a P-type thermo-electric thin-film layer 117, an insulating thin-film layer 118 and a N-type thermo-electric thin-film layer 119.

The P-type thermo-electric thin-film layer and the N-type thermo-electric thin-film layer is connected in one end of the insulating thin-film layer to form a three-layer PN junction. An insulating layer is provided between two adjacent PN junctions, and the two adjacent PN junctions is connected in one end of the insulating layer, in order to form a serial PN junction. Another electrode 110 is provided in the N-type thermo-electric thin-film layer 119 of the last three-layer PN junction. Thus, the main structure of thin-film thermo-electric generator as shown in FIG. 1i is formed. Then the thin-film thermo-electric generator is made by scribing, racking, packaging and related subsequent procedures.

The general materials of the thin-film thermo-electric generator are metal and semiconductor. The P-type and N-type thermo-electric materials in the embodiment of this invention may be two different metals or semiconductors made by depositing two different metal layers or semiconductors to form a thermo-electric generator. During the fabrication process, the depositing of N-type thermo-electric layer can be carried before or after the depositing of P-type thermo-electric thin-film layer.

Several methods can be applied to make the P-type and N-type thermo-electric thin-film layers, such as vacuum evaporation, Molecule Beam Epitaxy (MBE), magnetron sputtering, ion beam sputtering deposition, Laser Deposition, electrochemical atomic layer epitaxy (ECALE), metalorganic chemical vapor deposition (MOCVD), and successive ionic layer adsorption and reaction (SILAR). The first embodiment of the invention provides a fabrication process of the thin-film thermo-electric generator with the ion beam sputtering deposition:

The device is an ultrahigh vacuum ion beam sputtering deposition system. Selecting targets of P-type and N-type metals S.sub.b, B.sub.i and insulating material $Al_2O_3$, the purity of the target is 99.99%, and setting these targets in the target position respectively. Conducting ultrasonic washing on the substrate of common soda-lime glass, and put it in clamping fixture in the deposition room. The fixture may further have apparatuses for intentional sheltering in the two ends and the sides. In the room temperature, the deposition is carried by adjusting the targets and ion beam sputtering deposition, the procedures is as below:

Step 1: as shown in FIG. 1a, sheltering all sides of the glass substrate 101 other than in the area of the preset electrode 102.

Step 2: as shown in FIG. 1b, depositing a 300 nm thick $S_b$ thin-film layer 103 on the side of the substrate 101 on which the electrode is preset.

Step 3: as shown in FIG. 1c, sheltering the substrate 101, one end and all sides of the $S_b$ thin-film layer 103, and depositing a 500 nm thick $Al_2O_3$ thin-film layer 104 on the $S_b$ thin-film layer 103.

Step 4: as shown in FIG. 1d, sheltering the substrate 101 and all sides of the deposited thin-film layers, and depositing a 300 nm thick $B_i$ thin-film layer 105 on the deposited $Al_2O_3$ thin-film layer 104, the $S_b$ thin-film layer 103 and the Bi thin-film layer 105 is connected in one end of the $Al_2O_3$ thin-film layer 104 to form the first PN junction.

Step 5: as shown in FIG. 1e, sheltering the substrate 101 and all sides of the deposited thin-film layers, and depositing a 500 nm thick $Al_2O_3$ thin-film layer 106 on the Bi thin-film layer 105.

Step 6: as shown in FIG. 1f, sheltering the substrate 101 and all sides of the deposited thin-film layers, and depositing a 300 nm thick $S_b$ thin-film layer 107 on the $Al_2O_3$ thin-film layer 106, the $S_b$ thin-film layer 107 and the $B_i$ thin-film layer 105 is connected in one end of the $Al_2O_3$ thin-film layer 106 to form a connecting port between the first and the second PN junction.

Step 7 as shown in FIG. 1g, sheltering the substrate 101, one end and all sides of the deposited thin-film layers, and depositing a 500 nm thick $Al_2O_3$ thin-film layer 108 on the $S_b$ thin-film layer 107.

Step 8: as shown in FIG. 1h, sheltering the substrate 101 and all sides of the deposited thin-film layers, and depositing a 300 nm thick $B_i$ thin-film layer 109 on the $Al_2O_3$ thin-film layer 108, the $S_b$ thin-film layer 107 and the $B_i$ thin-film layer 109 is connected in one end of the $Al_2O_3$ thin-film layer 108 to form a second PN junction. The first and the second PN junction is connected in series through the $Al_2O_3$ thin-film layer 106.

Step 9: as shown in FIG. 1i, repeating the steps from Step 5 to Step 8 to form a $Al_2O_3$ thin-film layer 116, a $S_b$ thin-film layer 117, a $Al_2O_3$ thin-film layer 118, and a $B_i$ thin-film layer 119 respectively, accordingly a connection in series between a PN junction and a deposited PN junction is made, the connection of multiple three-layer PN junctions in series is available, an insulating layer is set among every three-layer PN junctions. During the deposition, the background vacuum degree is $4.5 \times 10^{-4}$ Pa, the working vacuum degree is $4.1 \times 10^{-2}$ Pa, and the working gas is 99.99% pure Ar with a rate of flow of 4 sccm. The technical parameters of the ion beam sputtering deposition are as below: plate voltage 1 KV, anode voltage 75V, acceleration voltage 220V, cathode voltage 7V, cathode current 11 A, and beam 14 mA. After obtaining one or multiple three-layer PN junctions in series by depositing on the substrate 101, another electrode 110 is extracted from the B.sub.i thin-film layer 119 in the last PN junction, thus the main structure of the thin-film thermo-electric generator as shown in FIG. 1i is formed.

During the above-said fabrication process, the depositing of N-type thermo-electric thin-film layer can be carried before or after the depositing of P-type thermo-electric thin-film layer.

In the first embodiment of this invention, the fabrication processes of thin-film thermo-electric generator with the magnetron sputtering are as below:

The device is a three-target magnetron sputtering system. Selecting targets of metals $S_b$, $B_i$ and Al, the purity of the target is 99.99%, and setting these targets in the target position respectively. Conducting ultrasonic washing on the substrate of common soda-lime glass, and put it in fixture in the deposition room. The fixture may further have apparatuses for intentional sheltering in the two ends and the sides. In the room temperature, during the deposition, the background vacuum is $4.5 \times 10^{-3}$ Pa, the working vacuum is $4.1 \times 10^{-2}$ Pa. During the deposition of $S_b$ and $B_i$ thin-film layer with DC magnetron sputtering, the working gas is 99.99% pure Ar with a rate of flow of 50 sccm. During the deposition of the $Al_2O_3$ thin-film layer with direct current magnetron reactive sputtering, the working gas is 99.99% pure Ar with a rate of flow of 50 sccm and the reactive gas 99.99% pure O2 with a rate of flow of 50 sccm. The processes of deposition are described as follows:

Step 1: as shown in FIG. 1a, sheltering all sides of the glass substrate 101 other than in the area of the preset electrode 102.

Step 2: as shown in FIG. 1b, depositing a 300 nm thick $S_b$ thin-film layer 103 n the side of the substrate 101 on which the electrode is preset.

Step 3: as shown in FIG. 1c, sheltering the substrate 101, one end and all sides of the $S_b$ thin-film layer 103, and depositing a 500 nm thick $Al_2O_3$ thin-film layer 104 on the $S_b$ thin-film layer 103.

Step 4: as shown in FIG. 1d, sheltering the substrate 101 and all sides of the deposited thin-film layers, and depositing a 300 nm thick $B_i$ thin-film layer 105 on the deposited $Al_2O_3$ thin-film layer 104, the $S_b$ thin-film layer 103 and the $B_i$ thin-film layer 105 is connected in one end of the $Al_2O_3$ thin-film layer 104 to form the first PN junction.

Step 5: as shown in FIG. 1e, sheltering the substrate 101 and all sides of the deposited thin-film layers. and depositing a 500 nm thick $Al_2O_3$ thin-film layer 106 on the $B_i$ thin-film layer 105.

Step 6: as shown in FIG. 1f, sheltering the substrate 101 and all sides of the deposited thin-film layers, and depositing a 300 nm thick $S_b$ thin-film layer 107 on the $Al_2O_3$ thin-film layer 106, the $S_b$ thin-film layer 107 and the $B_i$ thin-film layer 105 is connected in one end of the $Al_2O_3$ thin-film layer 106 to form a connecting port between the first and the second PN junction.

Step 7 as shown in FIG. 1g, sheltering the substrate 101, one end and all sides of the deposited thin-film layers, and depositing a 500 nm thick $Al_2O_3$ thin-film layer 108 on the $S_b$ thin-film layer 107.

Step 8: as shown in FIG. 1h, sheltering the substrate 101 and all sides of the deposited thin-film layers, and depositing a 300 nm thick $B_i$ thin-film layer 109 on the $Al_2O_3$ thin-film layer 108, the S.sub.b thin-film layer 107 and the $B_i$ thin-film layer 109 is connected in one end of the $Al_2O_3$ thin-film layer 108 to form a second PN junction. The first and the second PN junction is connected in series through the $Al_2O_3$ thin-film layer 106.

Step 9: as shown in FIG. 1i, repeating the steps from Step 5 to Step 8 to form a Al.sub.2O.sub.3 thin-film layer 116, a $S_b$ thin-film layer 117, a $Al_2O_3$ thin-film layer 118, and a $B_i$ thin-film layer 119 respectively, accordingly a connection in series between a PN junction and a deposited PN junction is made, the connection of multiple three-layer PN junctions in series is available, an insulating layer is set among every three-layer PN junctions. During the deposition, the background vacuum is $4.5 \times 10^{-4}$ Pa, the working vacuum is $4.1 \times 10^{-3}$ Pa, and the working gas is 99.99% pure Ar with a rate of flow of 4 sccm. The technical parameters of the ion beam sputtering deposition are as below: plate electrode voltage 1 KV, anode voltage 75V, acceleration voltage 220V, cathode voltage 7V, cathode current 11 A, and beam 14 mA. After obtaining one or multiple three-layer PN junctions in series by depositing on the substrate 101, another electrode 110 is extracted from the $B_i$ thin-film layer 119 in the last PN junction, thus the main structure of the thin-film thermo-electric generator as shown in FIG. 1i is formed.

During the above-said fabrication process, the depositing of N-type thermo-electric thin-film layer can be carried before or after the depositing of P-type thermo-electric thin-film layer.

Second Embodiment

The thin-film thermo-electric generator can be made by using the insulating substrate as well as the substrate of P-type thermo-electric material (or metal) or N-type thermo-electric material (or metal). If the substrate of P-type thermo-electric material is applied, the cross-section diagram of the thin-film thermo-electric generator is shown in FIG. 2h. In this embodiment, the thin-film thermo-electric generator comprises a P-type thermo-electric material substrate 201, an insulating thin-film layer 202, a N-type thermo-electric thin-film layer 203, an insulating thin-film layer 204, a P-type thermo-electric thin-film layer 205, an insulating thin-film layer 206, a N-type thermo-electric thin-film layer 207, an extractive electrode 208 and an extractive electrode 209.

Figure 2A:
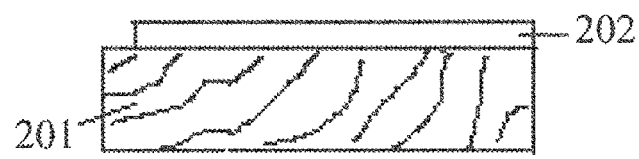
FIG. 2a-FIG. 2h are the schematic diagrams of the fabrication process of the second embodiment of the invention.

FIG. 2a shows the insulating thin-film layer 202 deposited on the P-type thermo-electric material substrate 201.

Figure 2B:
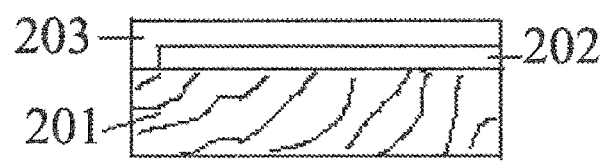

FIG. 2b shows the N-type thermo-electric thin-film layer 203 deposited on the insulating thin-film layer 202.

Figure 2C:
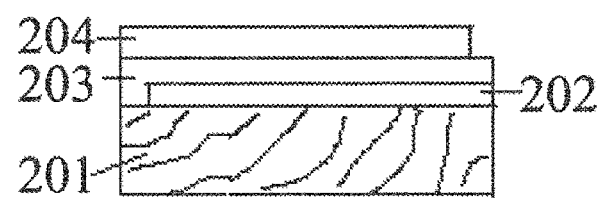

FIG. 2c shows the insulating thin-film layer 204 deposited on the N-type thermo-electric thin-film layer 203.

Figure 2D:

FIG. 2d shows the P-type thermo-electric thin-film layer 205 deposited on the insulating thin-film layer 204.

Figure 2E:
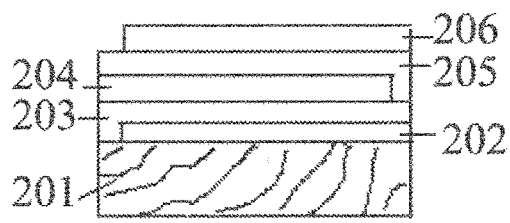

FIG. 2e shows the insulating thin-film layer 206 deposited on the P-type thermo-electric thin-film layer 205.

Figure 2F:
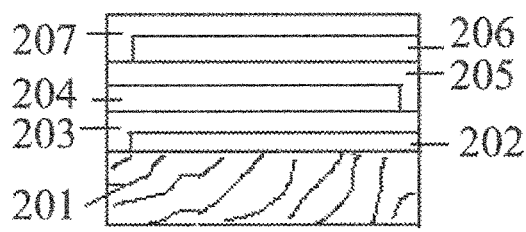

FIG. 2f shows the N-type thermo-electric thin-film layer 207 deposited on the insulating thin-film layer 206.

Figure 2G:
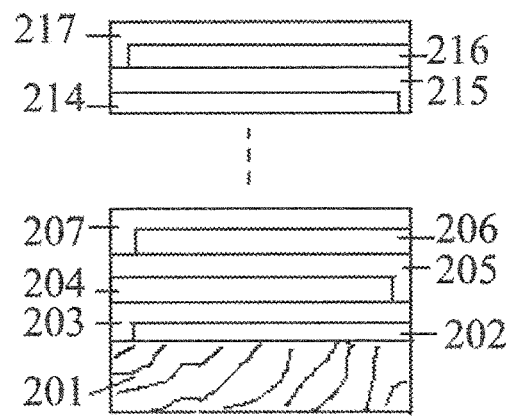
Figure 2H:
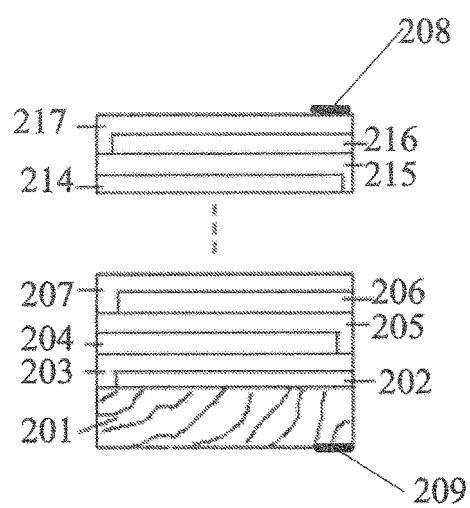

FIG. 2g shows the formation of an insulating thin-film layer 214, a P-type thermo-electric thin-film layer 215, an insulating thin-film layer 216 and a N-type thermo-electric thin-film layer 217.

In order to form a connection of a PN junction and a deposited PN junction in series, multiple connections of three-layer PN junctions in series may be applied, and an insulating thin-film layer is applied among the PN junctions. The three-layer P-type thermo-electric thin-film layer and the N-type thermo-electric thin-film layer is connected in one end of the insulating thin-film layer to form a PN junction. An insulating layer is provided between two adjacent PN junctions, and the two adjacent three-layer PN junctions is connected in one end of the insulating layer, in order to form a serial PN junction. An electrode 208 is provided in the N-type thermo-electric thin-film layer 217 of the last three-layer PN junction, an electrode 209 is provided in the side which is not deposited in the P-type thermo-electric material substrate 201. Thus, the main structure of the thin-film thermo-electric generator based on the P-type thermo-electric material substrate as shown in FIG. 2h is formed.

For the improvement of second embodiment, if the N-type thermo-electric material is applied as the substrate, the fabrication process of the N-type thermo-electric thin-film layer and the P-type thermo-electric thin-film layer shall be exchanged.

The Third Embodiment

The embodiment of the present invention has some other variations. For example, based on the structure of thin-film thermo-electric generator applying P-type thermo-electric material as the substrate as shown in FIG. 2g, depositing multiple connections in series of three-layer PN junctions on the other side of the P-type thermo-electric substrate 201, an insulating thin-film layer is provided between every three-layer PN junction, to form a thin-film thermo-electric generator provided in the third embodiment. As shown in FIG.

$3g$, the thin-film thermo-electric generator in this embodiment comprises a substrate 301 of P-type thermo-electric material as the base of thin-film thermo-electric generator structure, an insulating thin-film layer 302, a N-type thermo-electric thin-film layer 303, an insulating thin-film layer 304, a P-type thermo-electric thin-film layer 305, an extractive electrode 208 and an extractive electrode 209.

Figure 3A:
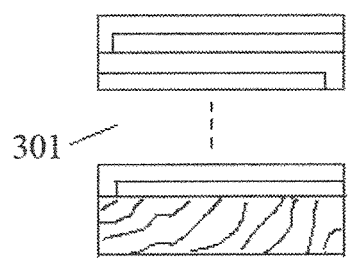
FIG. 3a-FIG. 3g are the schematic diagrams of the fabrication process of the third embodiment of the invention.

FIG. 3a shows a substrate 301 of P-type thermo-electric material as the base of thin-film thermo-electric generator structure in the FIG. 2g.

Figure 3B:
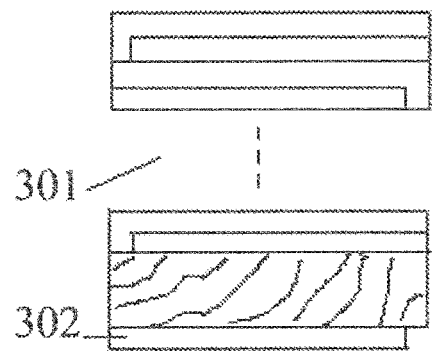

FIG. 3b shows an insulating thin-film layer 302 deposited on the other side of the substrate 301 of P-type thermo-electric material as the base of thin-film thermo-electric generator structure in the second embodiment of this invention.

Figure 3C:
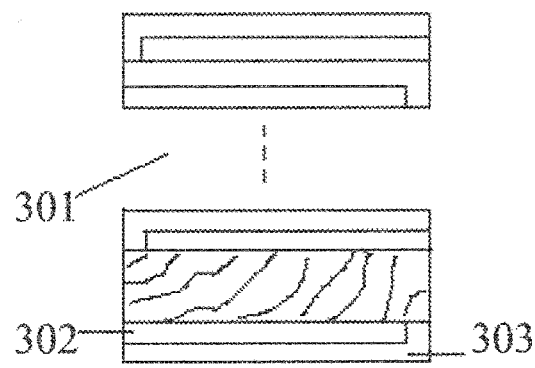

FIG. 3c shows a N-type thermo-electric thin-film layer 303 deposited on the insulating thin-film layer 302.

Figure 3D:
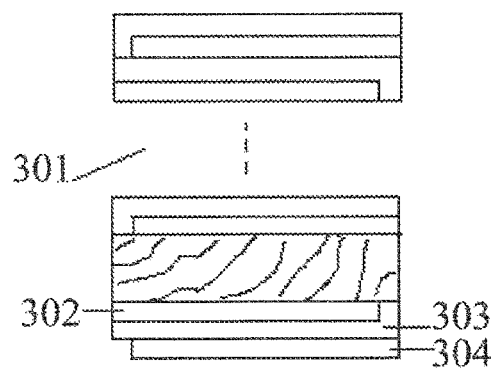

FIG. 3d shows the insulating thin-film layer 304 deposited on the N-type thermo-electric thin-film layer 303.

Figure 3E:
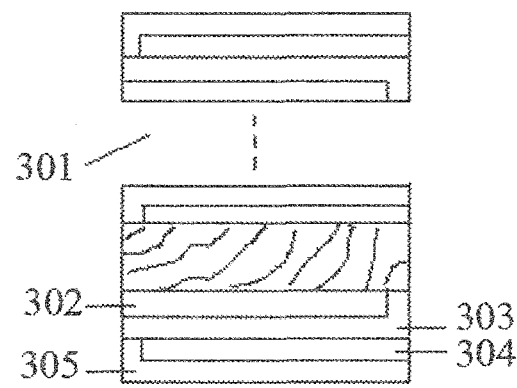

FIG. 3e shows the P-type thermo-electric thin-film layer 305 deposited on the insulating thin-film layer 304.

Figure 3F:
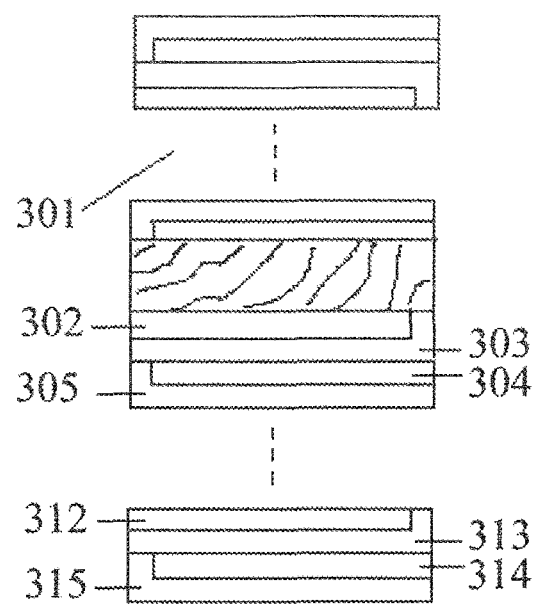
Figure 3G:
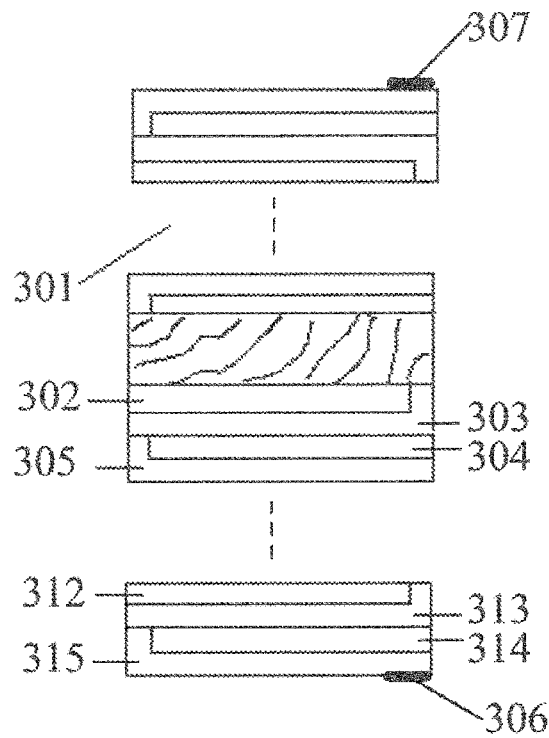

FIG. 3f shows the formation of an insulating thin-film layer 312, a P-type thermo-electric thin-film layer 313, an insulating thin-film layer 314 and a N-type thermo-electric thin-film layer 315. Multiple connections of three-layer PN junctions in series are available, an insulating thin-film is applied between every PN junctions. The three-layer P-type thermo-electric thin-film layer and N-type thermo-electric thin-film layer is connected in one end of the insulating thin-film layer, to form a PN junction. An insulating thin-film layer is applied between every PN junction, and the PN junctions are connected in one end of the insulating thin-film layer, to form connections of PN junctions in series.

An electrode 306 and an electrode 307 is extracted from the N-type thermo-electric thin-film layer of the last three-layer PN junction in the two sides of the P-type thermo-electric thin-film substrate to form the main structure of the thin-film thermo-electric generator deposited on the two-side P-type thermo-electric thin-film substrate.

For the improvement of the third embodiment, if the N-type thermo-electric material is applied as the substrate, the fabrication process of the N-type thermo-electric thin-film layer and the P-type thermo-electric thin-film layer shall be exchanged.

The Fourth Embodiment

Figure 4A:
FIG. 4a-FIG. 4h are the schematic diagrams of the fabrication process of the forth embodiment of the invention.
Figure 4B:
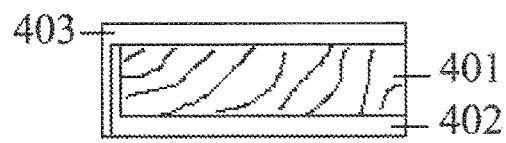
Figure 4C:
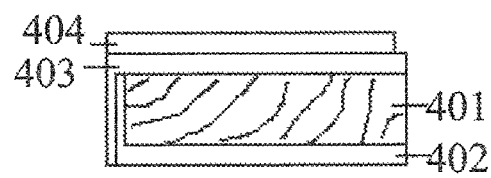
Figure 4D:
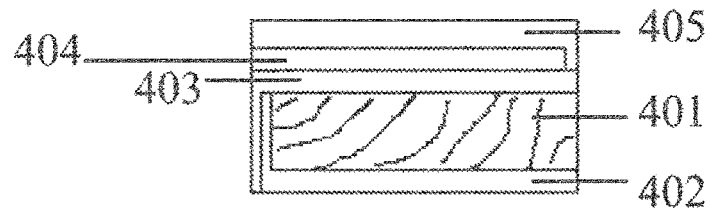
Figure 4E:
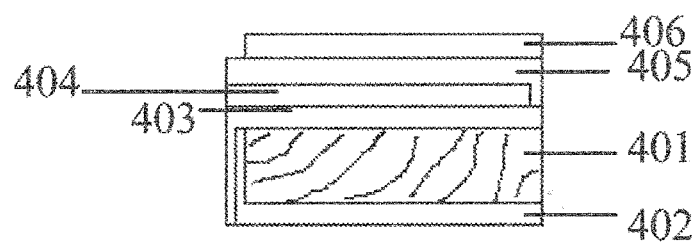
Figure 4F:
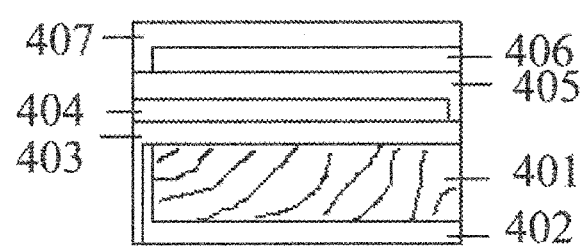
Figure 4G:
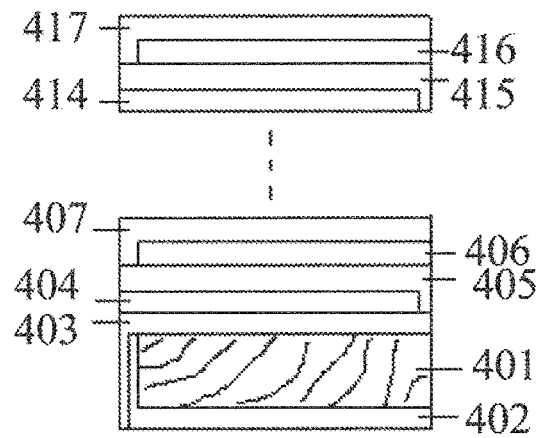
Figure 4H:
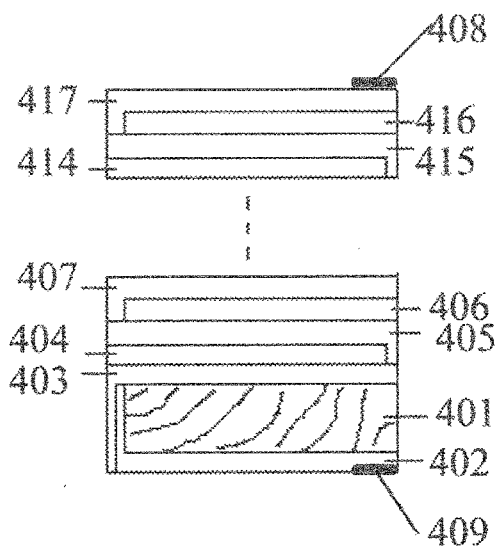

The thin-film thermo-electric generator based on insulating substrate in the first embodiment may have the structure as follows:

FIG. 4h is the cross-section view of the thin-film thermo-electric generator of this invention, which comprises an insulating substrate 401, a P-type thermo-electric thin-film layer 402, a N-type thermo-electric thin-film layer 403, an insulating thin-film layer 404, a P-type thermo-electric thin-film layer 405, an insulating thin-film layer 406, a N-type thermo-electric thin-film layer 407, an extractive electrode 408 and an extractive electrode 409.

FIG. 4a shows the P-type thermo-electric thin-film layer 402 deposited on one side of the insulating substrate 401;

FIG. 4b shows the N-type thermo-electric thin-film layer 403 deposited on the other side of the insulating substrate 401;

FIG. 4c shows the insulating thin-film layer 404 deposited on the N-type thermo-electric thin-film layer 403;

FIG. 4d shows the P-type thermo-electric thin-film layer 405 deposited on the insulating thin-film layer 404;

FIG. 4e shows the insulating thin-film layer 406 deposited on the P-type thermo-electric thin-film layer 405;

FIG. 4f shows N-type thermo-electric thin-film layer 407 deposited on the insulating thin-film layer 406;

FIG. 4g shows the formation of an insulating thin-film layer 414, a P-type thermo-electric thin-film layer 415, an insulating thin-film layer 416 and a N-type thermo-electric thin-film layer 417. Multiple connections of three-layer PN junctions in series are available, an insulating thin-film is applied between every PN junctions. The three-layer P-type thermo-electric thin-film layer and N-type thermo-electric thin-film layer is connected in one end of the insulating thin-film layer, to form a PN junction. An insulating thin-film layer is applied between every PN junction, and the PN junctions are connected in one end of the insulating thin-film layer, to form connections of PN junctions in series. An electrode 408 and an electrode 409 is extracted from the N-type thermo-electric thin-film layer of last three-layer PN junction on the two sides of the insulating substrate.

The Fifth Embodiment

Based on the structure of thin-film thermo-electric generator applying P-type thermo-electric material as the substrate as shown in FIG. 4g, depositing multiple connections in series of three-layer PN junctions on the other side of the P-type thermo-electric substrate, an insulating thin-film layer is provided between every three-layer PN junctions, to form a thin-film thermo-electric generator provided in the third embodiment. As shown in FIG. 5g, the thin-film thermo-electric generator in this embodiment comprises a base 501 of the thin-film thermo-electric generator structure shown in FIG. 4g, an insulating thin-film layer 502, a N-type thermo-electric thin-film layer 503, an insulating thin-film layer 504, a P-type thermo-electric thin-film layer 505, an extractive electrode 506 and an extractive electrode 507.

Figure 5A:
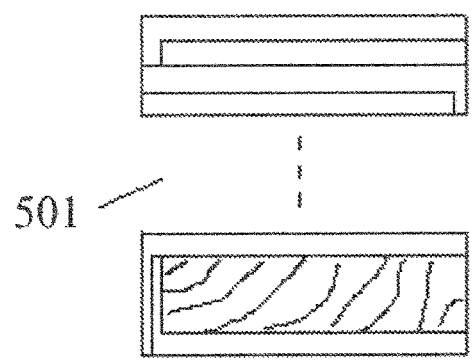
FIG. 5a-FIG. 5g are the schematic diagrams of the fabrication process of the fifth embodiment of the invention.
Figure 5B:
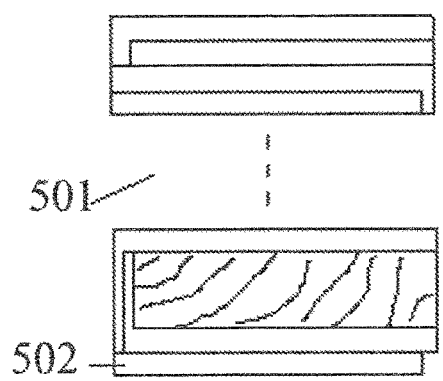
Figure 5C:
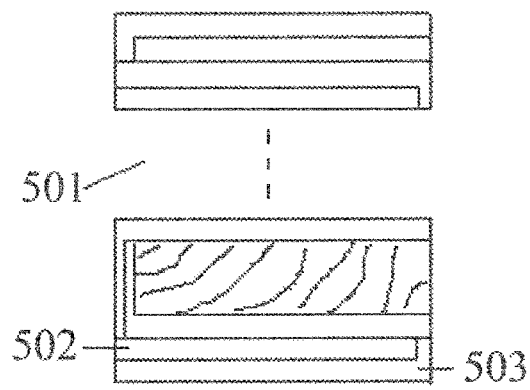
Figure 5D:
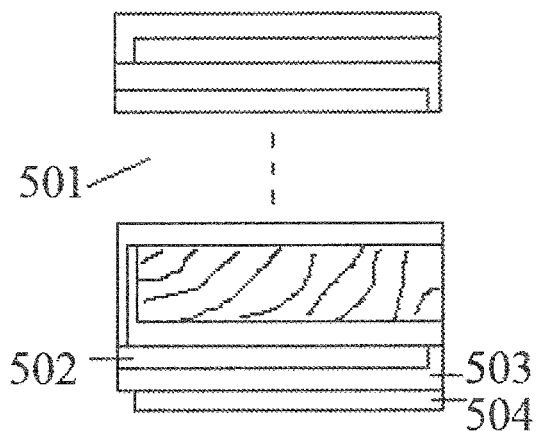
Figure 5E:
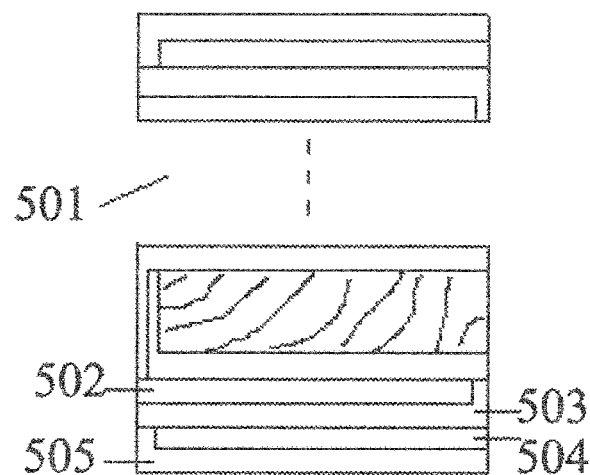
Figure 5F:
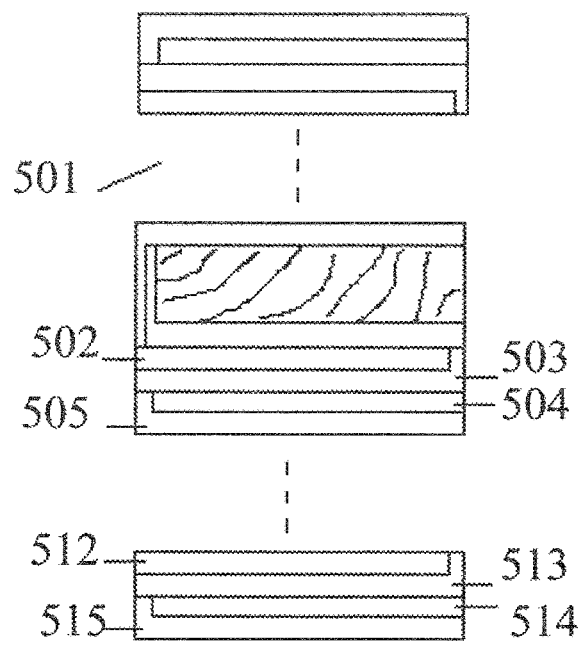
Figure 5G:
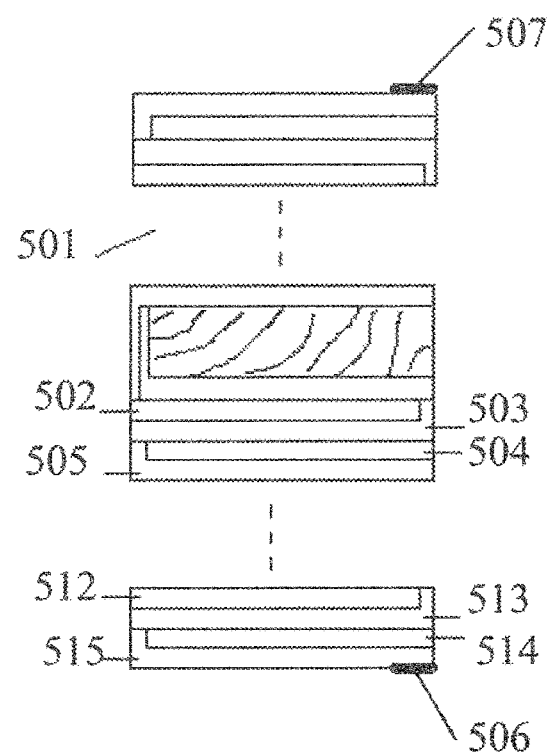

FIG. 5a shows the base 501 of the thin-film thermo-electric generator;

FIG. 5b shows an insulating thin-film layer 502 deposited on the base 501 of the P-type thermo-electric thin-film layer in the other side of the substrate of the thin-film thermo-electric generator as shown in FIG. 4g;

FIG. 5c shows the N-type thermo-electric thin-film layer 503 deposited on the insulating thin-film layer 502;

FIG. 5d shows the insulating thin-film layer 504 deposited on the N-type thermo-electric thin-film layer 503;

FIG. 5e shows the P-type thermo-electric thin-film layer 505 deposited on the insulating thin-film layer 504;

FIG. 5f shows the formation of an insulating thin-film layer 512, a P-type thermo-electric thin-film layer 513, an insulating thin-film layer 514 and a N-type thermo-electric thin-film layer 515. Multiple connections of three-layer PN junctions in series are available, an insulating thin-film is applied between every PN junctions. The three-layer P-type thermo-electric thin-film layer and N-type thermo-electric thin-film layer is connected in one end of the insulating thin-film layer, to form a PN junction. An insulating thin-film layer is applied between every PN junction, and the PN junctions are connected in one end of the insulating thin-film layer, to form connections of PN junctions in series.

An electrode 506 and an electrode 507 is extracted from the N-type thermo-electric thin-film layer of last three-layer PN junction on the two sides of the insulating substrate. Thus, the main structure of the thin-film thermo-electric generator two-sides deposited on the P-type thermo-electric material substrate as shown in FIG. 5g is formed.

During the above-said fabrication process in the fifth embodiment, the depositing of N-type thermo-electric thin-film layer can be carried before or after the depositing of P-type thermo-electric thin-film layer.

In all the above-said embodiments, the substrate can be regular a rectangle or a square or in any irregular shapes. The common thickness range of the substrate is from 0.1 mm to 100 mm. The substrate can be an insulating substrate, a P-type thermo-electric thin-film or a N-type thermo-electric thin-film substrate, or any other material substrate. The P-type and N-type thermo-electric thin-film materials in the thin-film thermo-electric generator can be the same or different, this is, in the whole thin-film thermo-electric generator, the PN junction can be made by two different metal thin-film layer and insulating layer, and can also be made by a pair of P-type and N-type thermo-electric thin-film layers and insulating layer. During the deposition of insulating layers, one end of them is deliberately sheltered. Wherein, the ion beam sputtering deposition and magnetron sputtering in the first embodiment can also be applied in the second, third, fourth and fifth embodiment, and some other methods such as vacuum evaporation, Molecule Beam Epitaxy (MBE), Laser Deposition, electrochemical atomic layer epitaxy (ECALE), metal-organic chemical vapor deposition (MOCVD), and successive ionic layer adsorption and reaction (SILAR) can be applied. Then the thin-film thermo-electric generator is made by scribing, racking, packaging and related subsequent procedures.

Thermo-electric phenomenon is reversible, and the semiconductor thermo-electric generation and refrigeration can be reversible. For a single PN junction, if the temperature difference is used for electricity generation, then the electricity can be used for refrigeration in the other end. Thus, the main thin-film thermo-electric generator structure can be the main structure of the thin-film thermo-electric cooler. The invention may be embodied in other specific form without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A method of manufacturing a thin-film thermo-electric generator, comprising the steps of:
   (a) forming two or more PN junctions each having a three-layer structure, wherein each of said PN junctions is formed by a step of depositing an insulating thin-film layer between a P-type thermo-electric thin-film layer and a N-type thermo-electric thin-film layer;
   (b) forming a substrate, which is a glass substrate, having a first side and an opposed second side;
   (c) coupling said PN junctions at said first side of said substrate to define a first group of PN junctions at said first side of said substrate and coupling said PN junctions at said second side of said substrate to define a second group of PN junctions at said second side of said substrate; and
   (d) providing two electrodes, wherein one of said electrodes is extracted from said first group of PN junctions.

2. The method as recited in claim 1 wherein, in the step (d), another said electrode is extracted from said second group of PN junctions.

3. The method, as recited in claim 1, wherein the step (c) further comprises the steps of:
   (c.1) orderly connecting two or more of said PN junctions in series to form said first group of PN junctions to be coupled at said first side of said substrate; and
   (c.2) orderly connecting two or more of said PN junctions in series to form said second group of PN junctions to be coupled at said second side of said substrate.

4. The method, as recited in claim 2, wherein the step (c) further comprises the steps of:
   (c.1) orderly connecting two or more of said PN junctions in series to form said first group of PN junctions to be coupled at said first side of said substrate; and
   (c.2) orderly connecting two or more of said PN junctions in series to form said second group of PN junctions to be coupled at said second side of said substrate.

5. The method, as recited in claim 1, wherein two of said insulating thin-film layers in said first and second groups of PN junctions are identical and are connected to said first and second sides of said substrate respectively.

6. The method, as recited in claim 4, wherein two of said insulating thin-film layers in said first and second groups of PN junctions are identical and are connected to said first and second sides of said substrate respectively.

7. The method, as recited in claim 2, wherein the step (d) further comprises the steps of:
   (d.1) extracting one of said electrodes from said N-type thermo-electric thin-film layer at the outermost position of said first group of PN junction; and
   (d.2) extracting another said electrode from said N-type thermo-electric thin-film layer at the outermost position of said second group of PN junction.

8. The method, as recited in claim 4, wherein the step (d) further comprises the steps of:
   (d.1) extracting one of said electrodes from said N-type thermo-electric thin-film layer at the outermost position of said first group of PN junction; and
   (d.2) extracting another said electrode from said N-type thermo-electric thin-film layer at the outermost position of said second group of PN junction.

9. The method, as recited in claim 6, wherein the step (d) further comprises the steps of:
   (d.1) extracting one of said electrodes from said N-type thermo-electric thin-film layer at the outermost position of said first group of PN junction; and
   (d.2) extracting another said electrode from said N-type thermo-electric thin-film layer at the outermost position of said second group of PN junction.

10. The method, as recited in claim 2, wherein in each of said PN junctions, said P-type thermo-electric thin-film layer and said N-type thermo-electric thin-film layer are connected one end PN said junction while said insulating thin-film layer is provided at another end in said PN junction and is partially provided between said P-type thermo-electric thin-film layer and said N-type thermo-electric thin-film layer.

11. The method, as recited in claim 9, wherein in each of said PN junctions, said P-type thermo-electric thin-film layer and said N-type thermo-electric thin-film layer are connected at one end in said PN junction while said insulating thin-film layer provided at another end in said PN junction and is partially provided between said P-type thermo-electric thin-film layer and said N-type thermo-electric thin-film layer.

12. The method, as recited in claim 2, wherein a thickness range of said substrate is 0.1 mm-100 mm, a thickness range of said P-type thermo-electric thin-film layer is 1 nm-10 μm, a thickness range of said N-type thermo-electric thin-film layer is 1 nm-10 μm.

13. The method, as recited in claim 2, wherein a shape of said substrate is regular rectangle, wherein said two electrodes respectively extracted from said PN junctions of said first and second groups of PN junctions at the outermost positions from said substrate respectively.

14. The method, as recited in claim 12, wherein a shape of said substrate is regular rectangle, wherein said two electrodes respectively extracted from said PN junctions of said first and second groups of PN junctions at the outermost positions from said substrate respectively.

\* \* \* \* \*